US009878390B2

(12) United States Patent
Senga et al.

(10) Patent No.: US 9,878,390 B2
(45) Date of Patent: Jan. 30, 2018

(54) SOLDER SUPPLY DEVICE INCLUDING A SOLDER CUP AND A NOZZLE SECTION WITH A FLANGE SECTION THAT IS ELASTICALLY DEFORMABLE

(71) Applicant: FUJI MACHINE MFG. CO., LTD., Chiryu (JP)

(72) Inventors: Akihiro Senga, Okazaki (JP); Shoji Fukakusa, Yokkaichi (JP)

(73) Assignee: FUJI MACHINE MFG. CO. LTD., Chiryu (JP)

( * ) Notice: Subject to any disclaimer, the term of this patent is extended or adjusted under 35 U.S.C. 154(b) by 0 days.

(21) Appl. No.: 15/100,879

(22) PCT Filed: Dec. 5, 2013

(86) PCT No.: PCT/JP2013/082710
§ 371 (c)(1),
(2) Date: Jun. 1, 2016

(87) PCT Pub. No.: WO2015/083272
PCT Pub. Date: Jun. 11, 2015

(65) Prior Publication Data
US 2016/0297021 A1  Oct. 13, 2016

(51) Int. Cl.
*B23K 3/06* (2006.01)
*H05K 3/34* (2006.01)
(Continued)

(52) U.S. Cl.
CPC ........ *B23K 3/0638* (2013.01); *B05C 11/1002* (2013.01); *B05C 17/00533* (2013.01);
(Continued)

(58) Field of Classification Search
CPC ........ B05B 9/047; H01H 36/02; G01D 5/145; G01D 11/245; G01F 23/70; G01F 23/74
(Continued)

(56) References Cited

U.S. PATENT DOCUMENTS 5,273,187 A * 12/1993 Suzuki ................ B01L 3/0293
  116/110
5,301,841 A *  4/1994 Fuchs .................. G01F 11/025
  222/135
(Continued)

FOREIGN PATENT DOCUMENTS

JP  2004-306102 A  11/2004
JP    2005-96126 A   4/2005
JP   2010-172928 A   8/2010

OTHER PUBLICATIONS

Extended European Search Report dated Oct. 28, 2016 in Patent Application No. 13898575.9.
(Continued)

*Primary Examiner* — Karl Kurple
(74) *Attorney, Agent, or Firm* — Oblon, McClelland, Maier & Neustadt, L.L.P.

(57) ABSTRACT

Solder supply device includes solder cup that is tubular and open at one end, nozzle section for ejecting solder from the solder cup, flange section that is fixedly provided on an outer circumferential section of the nozzle section and that is engaged inside of the solder cup, and inner tube an end of which holds the nozzle section and the other end of which extends from the opening of the solder cup; the flange section is formed from material that is elastically deformable and the flange section is engaged inside the cup with an outer edge section of the flange section in an elastically deformed state. The elastic force arising between the outer edge section of the flange section and the solder cup is smaller than the holding force of the nozzle section by the inner tube.

5 Claims, 15 Drawing Sheets

(51) Int. Cl.
   *B05C 17/005* (2006.01)
   *B05C 11/10* (2006.01)
   *B41F 15/40* (2006.01)
   *B41F 15/08* (2006.01)

(52) U.S. Cl.
   CPC .............. *B23K 3/06* (2013.01); *B23K 3/0607* (2013.01); *B41F 15/0881* (2013.01); *B41F 15/40* (2013.01); *B41F 15/405* (2013.01); *H05K 3/3468* (2013.01); *H05K 3/3478* (2013.01)

(58) Field of Classification Search
   USPC ...................................................... 239/71, 73
   See application file for complete search history.

(56) References Cited

U.S. PATENT DOCUMENTS

| | | | | | |
|---|---|---|---|---|---|
| 5,361,963 | A | * | 11/1994 | Ozawa | B23K 3/0607 118/256 |
| 5,647,510 | A | * | 7/1997 | Keller | B05C 17/00513 222/105 |
| 6,164,561 | A | * | 12/2000 | Yoshida | B05B 3/10 222/148 |
| 6,338,441 | B1 | * | 1/2002 | Umezawa | B05B 3/1064 239/104 |
| 9,156,056 | B2 | * | 10/2015 | Abe | B29C 67/0077 |
| 9,162,249 | B2 | * | 10/2015 | Koyama | B05C 5/0225 |
| 2002/0038814 | A1 | * | 4/2002 | Mimura | B23K 3/0607 228/256 |
| 2009/0278875 | A1 | * | 11/2009 | Holm | B05B 7/0408 347/10 |
| 2013/0087057 | A1 | * | 4/2013 | Kondo | H05K 3/1233 101/123 |
| 2014/0224860 | A1 | * | 8/2014 | Biggs | B23K 3/0638 228/33 |

OTHER PUBLICATIONS

Office Action dated Aug. 8, 2017 in Japanese Patent Application No. 2015-551347 (with English translation).
Office Communication dated Oct. 18, 2017, in European Patent Application No. 13 898 575.9.
Chinese Office Action dated Oct. 10, 2017 in Chinese Application No. 201380081386.7 with English translation, 13 pages.

* cited by examiner

Y-axis direction
X-axis direction

SOLDER SUPPLY DEVICE INCLUDING A SOLDER CUP AND A NOZZLE SECTION WITH A FLANGE SECTION THAT IS ELASTICALLY DEFORMABLE

TECHNICAL FIELD

The present disclosure relates to a solder supply device for supplying liquid solder from a solder container housing liquid solder, the solder container being tubular and open at one end.

BACKGROUND ART

In a solder supply device that supplies liquid solder from a solder container as disclosed in the patent literature below, a piston integrated with a nozzle is engaged inside the solder container. Also, at least a portion of the outer circumferential section of the piston is formed from an elastically deformable material. Accordingly, the outer circumferential section of the piston adheres to the inside wall surface of the solder container, such that solder adhered to the inside wall surface of the solder container can be supplied from the solder container without any solder being left inside the solder container.

Patent Literature 1: Japanese Unexamined Patent Application Publication Number 2010-172928

SUMMARY

Technical Problem

According to the solder supply device disclosed in the above patent literature, it is possible to supply solder from the solder container without any solder being left inside the solder container. However, because elastic force arises between the at least a portion of the outer circumferential section of the piston formed from elastically deformable material and the inside wall surface of the solder container, it is difficult to remove the piston from inside the solder container, and exchange work of the solder container is complex. In particular, with a solder supply device in which the piston integrated with the nozzle is held by a holding member, there are cases in which the piston is removed from inside the solder container after the holding member and the piston are separated, which makes exchange work of the solder container even more complex. The present disclosure takes account of such problems and an object thereof is to provide a solder supply device that enables exchange work of a solder container to be performed in few steps.

Solution to Problem

To solve the above problems, in one embodiment, the solder supply device is a solder supply device comprising: a solder container housing liquid solder that is tubular and open at one end; a nozzle, for ejecting solder from the solder container, that is inserted into the solder container; a piston that is fixedly provided on an outer circumferential section of the nozzle and that is engaged inside of the solder container from the opening of the solder container; and a holding member an end of which holds at least one of the nozzle and the piston at one end, and the other end of which extends from the opening of the solder container, wherein at least a portion of an outer edge section of the piston is formed from an elastically deformable material, the piston is engaged inside the solder container with at least the portion of the outer edge section in an elastically deformed state, and the elastic force arising between the outer edge section of the piston and an inside section of the solder container is smaller than the holding force of at least one of the nozzle and the piston by the holding member.

Further, in another embodiment, the solder supply device is further provided with an outer tube that is tubular with an opening at one end and that stores the solder container in a state with the other end of the solder container engaged from the opening, and the solder container and the piston are relatively moved by air being supplied to an air chamber that is demarcated by the other end of the solder container and the other end of the outer tube, so as to supply solder from the tip of the nozzle.

Further, in another embodiment, wherein the solder supply device is further provided with a lock mechanism for detachably attaching at least one of the nozzle and the piston to the holding member, and the holding member holds at least one of the nozzle and the piston by at least one of the nozzle and the piston being attached to the holding member by the lock mechanism.

Further, in another embodiment, the nozzle is formed from an elastically deformable material, the holding member holds the nozzle by elastic deformation of the nozzle, and the elastic force arising between the outside edge section of the piston and the inside of the solder container is smaller than the elastic force which depends on the elastic deformation of the nozzle.

Further, in another embodiment, a total dimension of a thickness dimension of the piston and a length dimension of the holding member is longer than a depth dimension of the solder container.

Further, in another embodiment, a length dimension of the nozzle is shorter than a depth dimension of the solder container.

Advantageous Effects

With the solder supply device of one embodiment, the elastic force arising between the outer edge section of the piston and the inside of the solder container (hereinafter sometimes referred to as container internal elastic force) is smaller than the holding force of at least one of the nozzle and the piston by the holding member. Thus, by holding the holding member and the solder container and pulling at least one of the holding member and the solder container in a direction away from the other, the piston integrated with the nozzle is removed from the solder container. This enables the solder container to be separated easily from the solder supply device and allows solder container exchange work to be completed with few steps.

Further, with the solder supply device of another embodiment, the solder container is engaged from the bottom surface inside a tubular outer tube with an opening at one end. And, by air being supplied to an air chamber demarcated by the bottom surface of the outer tube and the bottom surface of the solder container, the solder container and the piston move relatively, such that solder is supplied from the solder container. In other words, the piston and solder container move relatively by the bottom surface of the solder container being pressed directly by air. By this, the pressure inside the solder container increases and solder is supplied from the solder container. In this way, according to the solder supply device of this embodiment, it is possible to supply solder from a solder container without using an air cylinder, electromagnetic motor, or the like, and it is possible to make the solder supply device compact and having a simple construction and so on.

Further, the solder supply device of another embodiment has a lock mechanism for detachably attaching at least one of the nozzle and the piston to the holding member. And, the piston integrated with the nozzle is held by the holding member using the lock mechanism. By this, the holding force of the holding member is made to be large reliably by the container internal elastic force, thus making exchange work of the solder container simple. Also, by releasing the lock mechanism, it is possible to easily separate the piston integrated with the nozzle and the holding member. This enables the nozzle and piston, which directly contact the solder, to be cleaned individually.

Further, with the solder supply device of another embodiment, the nozzle is formed from an elastically deformable material, and the holding member holds the nozzle by elastic deformation of the nozzle. And, the container internal elastic force is smaller than the elastic force which depends on the elastic deformation of the nozzle. This enables the container internal elastic force to be smaller than the holding force of the nozzle without providing a lock mechanism, thus enabling the construction of the solder supply device to be simpler. Also, by making the elastic force which depends on the elastic deformation of the nozzle somewhat small, it is possible to easily separate the piston integrated with the nozzle and the holding member. This enables the nozzle and piston, which directly contact the solder, to be cleaned individually.

Further, with the solder supply device of another embodiment, a total dimension of a thickness dimension of the piston and a length dimension of the holding member is longer than a depth dimension of the solder container. Thus, when the piston and the bottom surface of the solder container contact, that is when the solder container becomes empty, the end of the holding member extends from the opening of the solder container. This enables an operator to easily grasp the holding member when the solder container has become empty, thus enabling solder container exchange work to be performed easily.

Further, with the solder supply device of another embodiment, a length dimension of the nozzle is shorter than a depth dimension of the solder container. In a case in which the container internal elastic force is smaller than the holding force of the holding member, as described above, the piston integrated with the nozzle is removed from inside the solder container together with the holding member. That is, because the piston integrated with the nozzle does not remain inside the solder container, it is not necessary for the length dimension of the nozzle to be longer than the depth dimension of the solder container. Thus, by making the length dimension of the nozzle shorter than the depth dimension of the solder container, the amount of solder that remains inside the nozzle is made small.

FIRST EMBODIMENT

<Configuration of Solder Printer>

Figure 1:
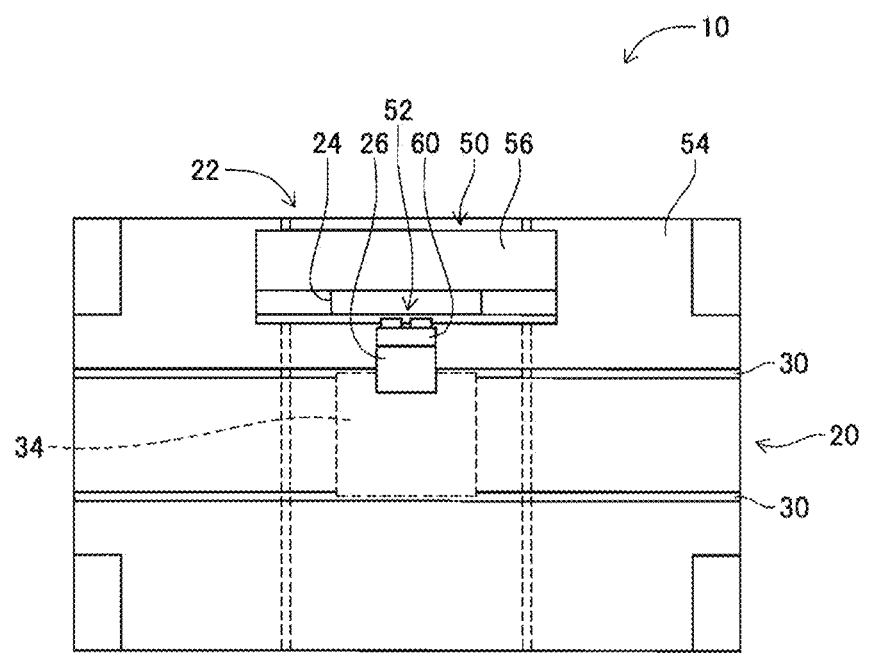
FIG. 1 is a plan view showing a solder printer of an embodiment.

FIG. 1 shows solder printer 10 as an embodiment of the disclosure. Solder printer 10 is a device that prints solder paste onto a circuit board. Solder printer 10 is provided with conveyance device 20, moving device 22, squeegee device 24, and solder supply device 26.

Conveyance device 20 has a pair of conveyor belts 30 that extend in the X-axis direction, and electromagnetic motor (refer to FIG. 4) 32 that moves conveyor belts 30. The pair of conveyor belts 30 support circuit board 34 and circuit board 34 is conveyed in the X-axis direction by the driving of electromagnetic motor 32. Also, conveyance device 20 has holding device (refer to FIG. 4) 36. Holding device 36 fixedly holds circuit board 34 supported by conveyor belts 30 in a predetermined position (the position at which circuit board 34 is shown in FIG. 1). Note that a metal mask (not shown) is loaded on the upper surface of circuit board 34.

Moving device 22 is configured from Y-axis direction slide mechanism 50 and X-axis direction slide mechanism 52. Y-axis direction slide mechanism 50 has Y-axis slider 56 provided on base 54 so as to be movable in the Y-axis direction. Y-axis slider 56 is moved to any position in the Y-axis direction by the driving of electromagnetic motor (refer to FIG. 4) 58. Also, X-axis direction slide mechanism 52 has X-axis slider 60 provided on a side surface of Y-axis slider 56 to be movable in the X-axis direction. X-axis slider 60 is moved to any position in the X-axis direction by the driving of electromagnetic motor (refer to FIG. 4) 62.

Squeegee device 24 is attached to Y-axis slider 56 about conveyance device 20, and moves to any position above circuit board 34 that is held by conveyance device 20. Squeegee device 24 has a squeegee (not shown) and the squeegee is held extending downwards by squeegee device 24 to be movable in the Y-axis direction and the up/down directions. Further, the squeegee is moved in the Y-axis direction by the driving of electromagnetic motor (refer to FIG. 4) 66, and is moved up/down by the driving of electromagnetic motor (refer to FIG. 4) 68.

Figure 2:
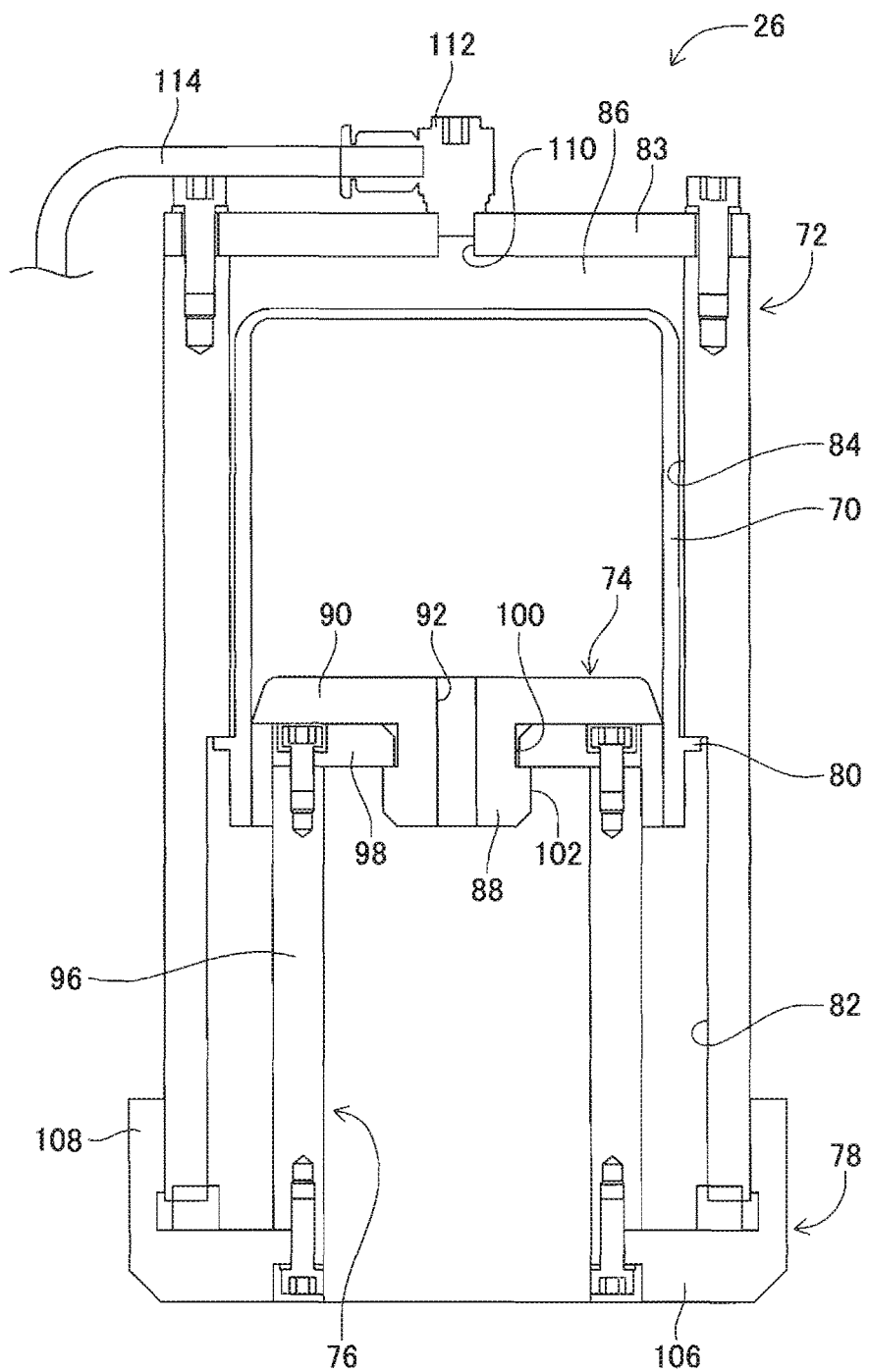
FIG. 2 is a cross-section view showing a solder supply device provided in the solder printer of FIG. 1.

Solder supply device 26 is detachably mounted on X-axis slider 60 and is moved to any position above base 54 by moving device 22. As shown in FIG. 2, solder supply device 26 has solder cup 70, outer tube 72, supply nozzle 74, inner tube 76, and fixed lid 78. Solder cup 70 is a bottomed cylindrical container with an opening at one end; solder cup 70 is filled with solder paste. Flange section 80 is formed on the outer circumferential surface at the opening side of solder cup 70; a screw thread (not shown) is formed between flange 80 and the edge of the opening side. Solder cup 70 is sold commercially with a lid (not shown) that engages with the screw thread covering the opening. That is, solder paste manufacturers sell solder cups 70 after filling solder cups 70 with solder paste and covering the opening with a lid. Users purchase solder cups 70 and use them with the lid removed.

Also, outer tube 72 is a bottomed cylinder with an opening at one end; solder cup 70 is stored inside outer tube 72. In detail, the inner circumferential surface of outer tube 72 is configured from first inner circumferential surface 82 that is positioned at the opening side of outer tube 72, and second inner circumferential surface 84 that is positioned at bottom surface 83 of outer tube 72. The inside diameter of first inner circumferential surface 82 is slightly larger than the outer diameter of flange section 80 of solder cup 70; the inside diameter of second inner circumferential surface 84 is slightly larger than the outer diameter of the tubular section of solder cup 70. Further, the end of the bottom side of solder cup 70 is engaged from the opening of outer tube 72 such that solder cup 70 is stored in outer tube 72. By this, solder cup 70 is slidable inside outer tube 72. However, the depth dimension of a portion of second inner circumferential surface 84 of outer tube 72 is longer than the length dimension from flange section 80 of solder cup 70 to the bottom surface, and flange section 80 of solder cup 70 stored in outer tube 72 contacts the step surface between first inner circumferential surface 82 and second inner circumferential surface 84 of outer tube 72. Therefore, space 86 is formed between the bottom surface of solder cup 70 and bottom surface 83 of outer tube 72. Note that, herein, the bottom surface refers to the surface on the opposite side to the opening of a bottomed cylindrical member. In other words, even if the surface on the opposite side to the opening of a bottomed cylindrical member is positioned towards the top, and the opening is positioned towards the bottom, the surface on the opposite side to the opening is given as the bottom surface, not the lid.

Also, supply nozzle 74 is configured from nozzle section 88 and flange section 90; nozzle section 88 and flange section 90 are formed as one body from material that is elastically deformable. Nozzle section 88 is substantially cylindrical with nozzle hole 92 formed running through the inside. Flange section 90 extends in a disk shape from the outer circumferential surface of an end of the nozzle section; the outer diameter of flange section 90 is slightly larger than the inside diameter of solder cup 70. Also, flange section 90 is engaged inside solder cup 70 such that nozzle section 88 faces the opening side of solder cup 70; supply nozzle 74 slides inside solder cup 70 with the outer circumferential section of flange section 90 elastically deformed.

Further, inner tube 76 has cylindrical tube section 96, and ring section 98 that covers the edge of tube section 96; supply nozzle 74 is held by ring section 98. In detail, the outer circumferential surface of nozzle section 88 of supply nozzle 74 is configured from first outer surface 100 positioned on the flange section 90 side and second outer circumferential surface 102 positioned at the tip side of nozzle section 88; the outer diameter of first outer diameter surface 100 is smaller than the outer diameter of second outer circumferential surface 102. On the other hand, the inside diameter of ring section 98 of inner tube 76 is slightly larger than the outer diameter of first outer circumferential surface 100 and slightly smaller than the outer diameter of second outer circumferential surface 102. Also, nozzle section 88 engages with the inside diameter section of ring section 98 while a portion of second circumferential surface 102 is elastically deformed, and the inside diameter of ring section 98 and outer circumferential surface 100 of nozzle section 88 engage. By this, inner tube 76 holds supply nozzle 74 using ring section 98. Note that, inner tube 76 holds supply nozzle 74 using ring section 98, therefore inner tube 76 is positioned inside solder cup 70; however, the end of the side not positioned at ring section 98 of tube section 96 extends from the opening of solder cup 70.

Also, by pulling supply nozzle 74 away from inner tube 76, a portion of second outer circumferential 102 of nozzle section 88 is elastically deformed such that supply nozzle 74 can be removed from inner tube 76. However, the force required to elastically deform the portion of second outer circumferential surface 102 of nozzle 88 when removing supply nozzle 74 from inner tube 76, that is the holding force of supply nozzle 74 by inner tube 76, is larger than the friction that arises between flange section 90 of supply nozzle 74 engaged inside solder cup 70 and the inner circumferential surface of solder cup 70. Thus, when inner tube 76 holding suction nozzle 74 is pulled in a direction away from solder cup 70, supply nozzle 74 is not separated from inner tube 76, and is removed from solder cup 70 together with inner tube 76.

Further, fixed lid 78 has ring section 106, and erected section 108 established around the entire circumference at the outer edge of ring section 106. A screw thread (not shown) is formed on the inner circumferential surface of erected section 108, the screw thread being engaged with the screw thread (not shown) formed at the opening end side of outer tube 72. By this, fixed lid 78 is removably attached to the opening of outer tube 72. Also, the inside diameter of ring section 106 is substantially the same as the inside diameter of tube section 96 of inner tube 76, and the end section that extends from solder cup 70 of tube section 96 is fixed to the inside edge of ring section 106. Thus, by removing fixed lid 78 from outer tube 72, inner tube 76 is also removed from inside outer tube 72. In this case, supply nozzle 74 held by inner tube 76 is also removed from inside outer tube 72. Further, solder cup 70 is also removed from outer tube 72 by the friction arising between flange section 90 of supply nozzle 74 and the inner circumferential surface of solder cup 70. That is, by removing fixed lid 78 from outer tube 72, inner tube 76, supply nozzle 74, and solder cup 70 are removed as one from outer tube 72.

Also, through-hole 110 is formed in bottom surface 83 of outer tube 72, and air adapter 112 is attached in through-hole 110. Air adapter 112 is connected to an end of air tube 114, and the other end of air tube 114 is connected to air supply device (refer to FIG. 4) 122. By this, air is supplied from air supply device 122 to space 86 inside outer tube 72. When air is supplied to space 86, the bottom surface of solder cup 70 is pressed towards supply nozzle 74 and solder cup 70 moves down. In this case, the solder paste filling solder cup 70 is compressed and is ejected from nozzle hole 92 of supply nozzle 74. Solder paste ejected from nozzle hole 92 passes through tube section 96 of inner tube 76, and the inner section of ring section 106 of fixed lid 78, and is ejected to the outside of solder supply device 26. Thus, solder supply device 26 supplies solder paste.

In this way, with solder supply device 26, space 86 is demarcated by the bottom surface of solder cup 70 and bottom surface 83 of outer tube 72, with space 86 functioning as an air chamber. That is, by the bottom surface of solder cup 70 being directly pressed by air, solder paste inside solder cup 70 is ejected from nozzle hole 92. Thus, with solder supply device 26, it is not necessary to provide a cylinder device or the like for pushing solder cup 70, and solder supply device 26 can be made more compact. Also, because there is no need to provide a cylinder device or the like, costs are reduced. Further, because there is no need to provide a cylinder device or the like, the configuration of solder supply device 26 can be made simple.

Figure 3:
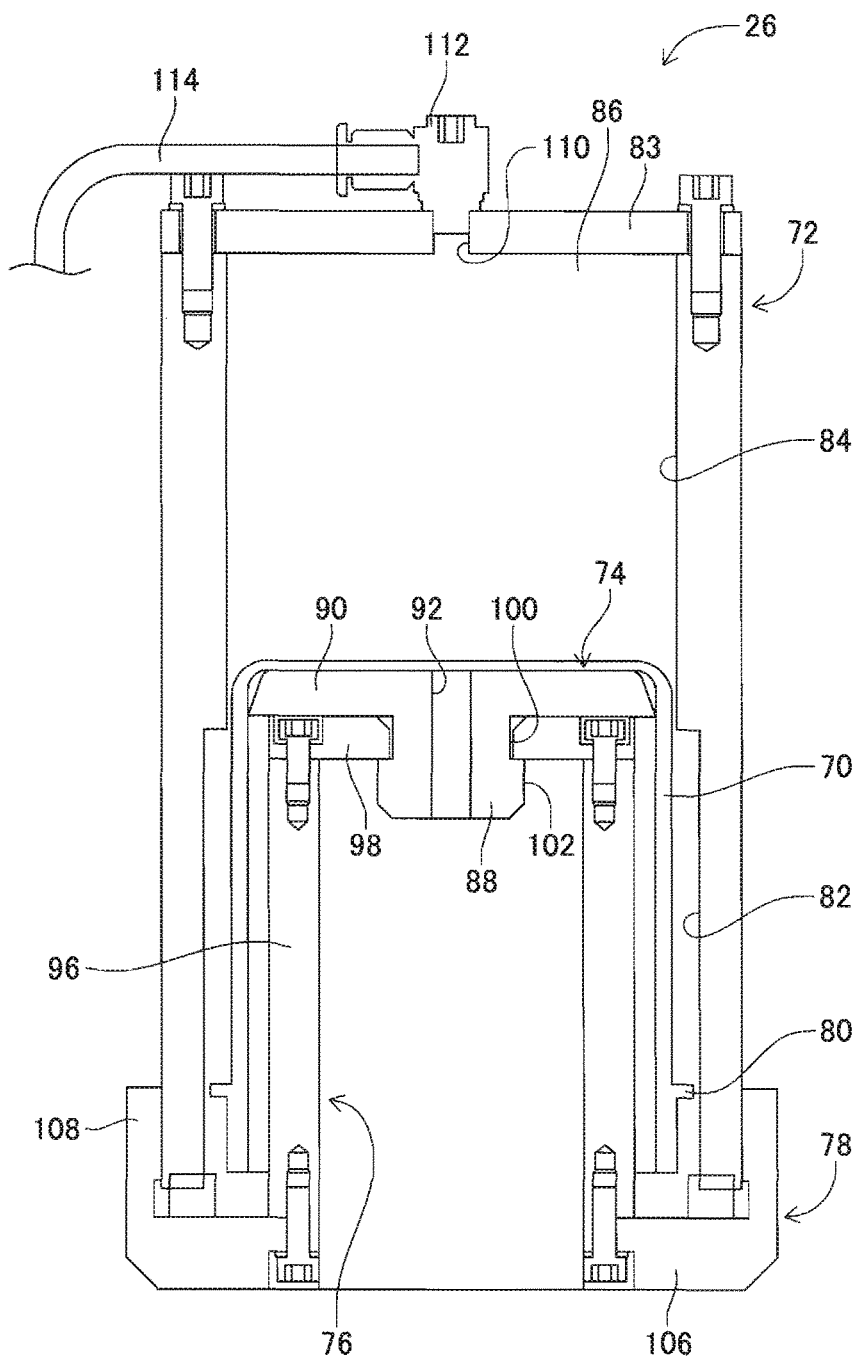
FIG. 3 is a cross-section view showing the solder supply device of FIG. 2 when the solder cup is empty.

Also, the total dimension of the thickness dimension of flange section 90 and the length dimension of inner tube 76 is longer than a depth dimension of solder cup 76. Thus, as shown in FIG. 3, by the downward movement of solder cup 70, the opening of solder cup 70 does not contact fixed lid 78, while the bottom surface of solder cup 70 contacts flange section 90 of supply nozzle 74. By this, solder is supplied from supply nozzle 74 without solder remaining in solder cup 70.

Figure 4:
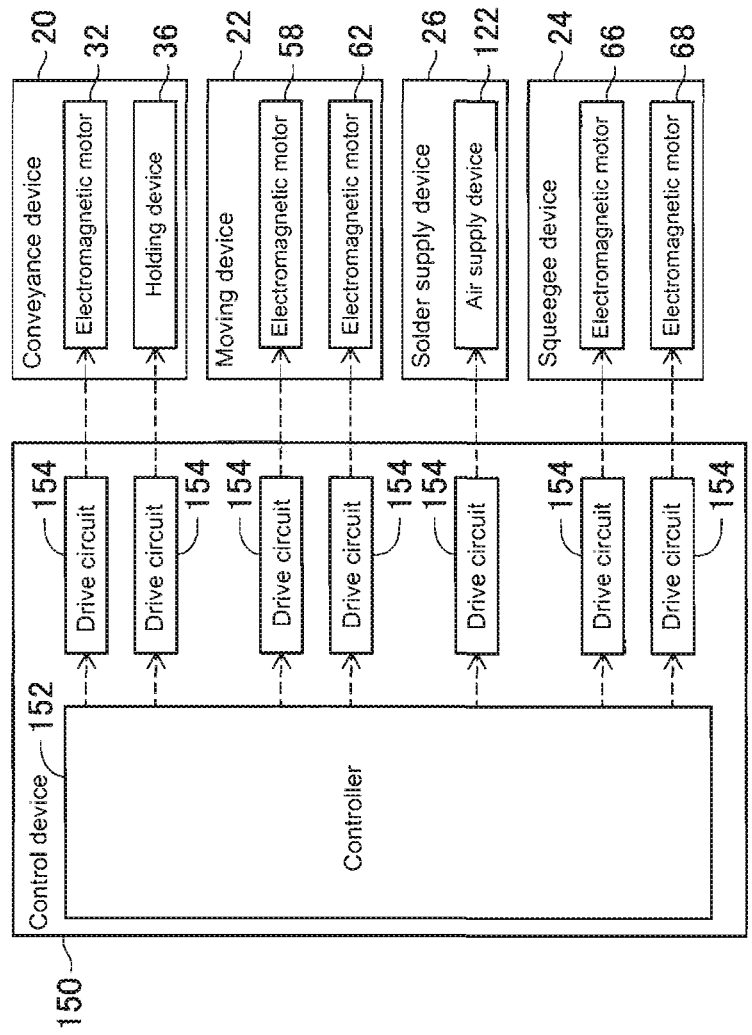
FIG. 4 is a block diagram showing the control device provided in the solder printer of FIG. 1.

Also, as shown in FIG. 4, solder printer 10 is provided with control device 150. Control device 150 is provided with controller 152 and multiple drive circuits 154. Multiple drive circuits 154 are connected to the above-mentioned electromagnetic motors 32, 58, 62, 66, and 68, holding device 36, and air supply device 122. Also, controller 152 is provided with a CPU, ROM, and RAM, forming the main parts of a computer, and is connected to the multiple drive circuits 154. Thus, the operation of conveyance device 20, moving device 22, squeegee device 24, and solder supply device 26 is controlled by controller 152.

<Printing of Solder Paste to Circuit Board>

With solder printer 10, according to the above-described configuration, solder paste is supplied onto the upper surface of a metal mask loaded on circuit board 34 by solder supply device 26, and that solder paste is applied by squeegee device 24. Pattern holes matching the pattern of the pads and so on of circuit board 34 are formed in the metal mask, and solder paste is printed onto circuit board 34 via the pattern holes.

Specifically, based on commands of controller 152, circuit board 34 is conveyed to a work position, and fixedly held at that position by holding device 36. Then, solder supply device 26, based on commands of controller 152, moves to a prescribed position above circuit board 34. Continuing, based on commands of controller 152, solder supply device 26 supplies air from air supply device 122 into space 86 inside outer tube 72. By this, solder paste is ejected from nozzle hole 92, thus supplying solder paste onto the upper surface of the metal mask loaded on circuit board 34. Next, based on commands of controller 152, squeegee device 24 is moved above the location where solder paste was supplied. Then, based on commands of controller 152, squeegee device 24 moves a squeegee down and then moves in the Y-axis direction. By this, solder paste is applied on the upper surface of the metal mask, and solder paste thus enters into the pattern holes. In this manner, solder printer 10 prints solder paste onto circuit board 34.

<Solder Cup Exchange>

When printing solder paste onto circuit board 34 as described above, because solder paste is supplied from solder cup 70 of solder supply device 26, solder cup 70 empties. Thus, a solder cup 70 which has become empty must be exchanged for a solder cup 70 which is full of solder paste. The exchange procedure for solder cup 70 is described below.

Figure 5:
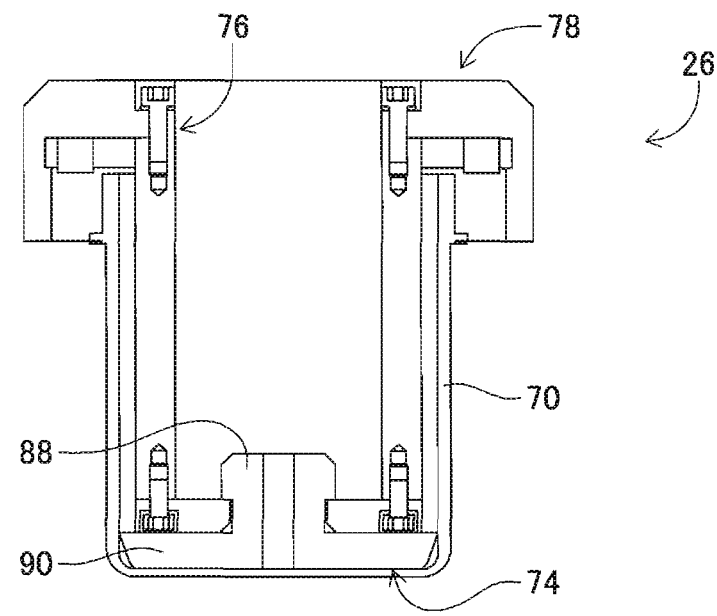
FIG. 5 is a cross-section view showing the solder supply device with the outer tube removed.
Figure 5:
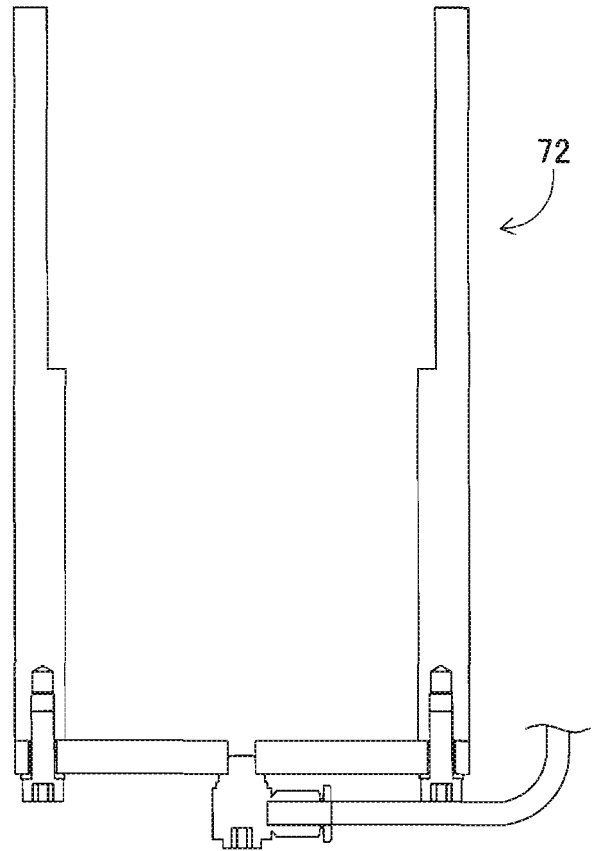

First, solder supply device 26 is removed from X-axis slider 60 and removed from solder printer 10. Then, fixed lid 78 is rotated counterclockwise with respect to outer tube 72 to release the engagement of fixed lid 78 and outer tube 72. By this, as shown in FIG. 5, fixed lid 78, inner tube 76, supply nozzle 74, and solder cup 70 are removed as one from outer tube 72.

Figure 6:
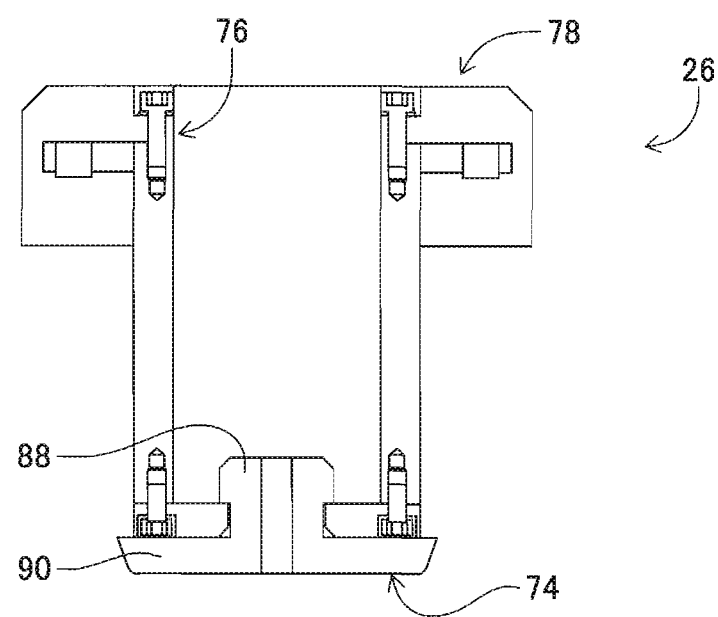
FIG. 6 is a cross-section view showing the solder supply device with the solder cup removed.
Figure 6:
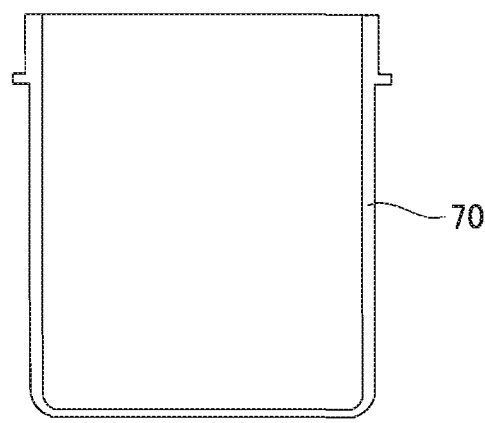

Next, at least one of solder cup 70 and fixed lid 78 is pulled away from the other. By this, as shown in FIG. 6, fixed lid 78, inner tube 76, and supply nozzle 74 are separated as one from solder cup 70. That is, supply nozzle 74 is removed from the inside of empty solder cup 70 along with inner tube 76.

Figure 7:
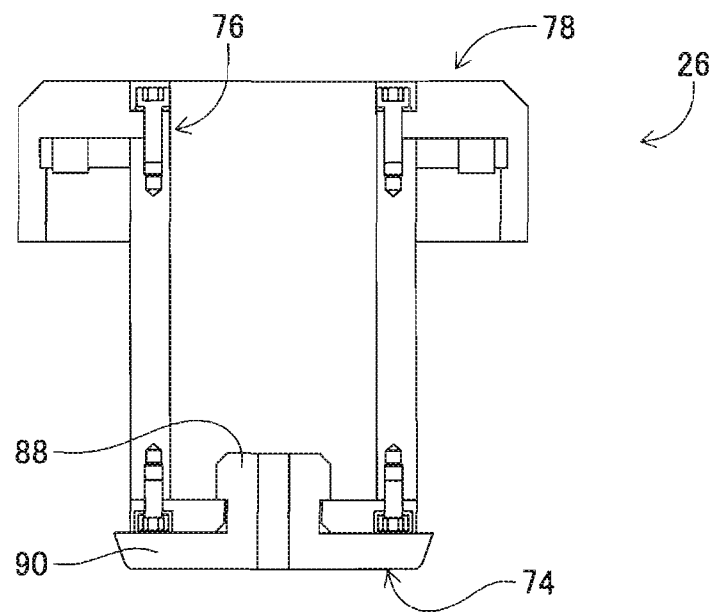
FIG. 7 is a cross-section view showing the solder supply device with a new solder cup housed inside the outer tube.
Figure 7:
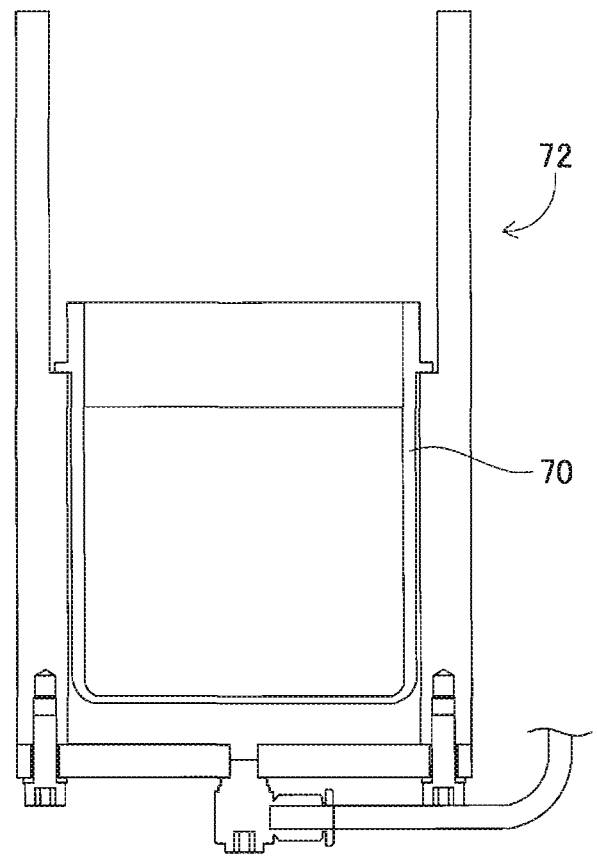
Figure 8:
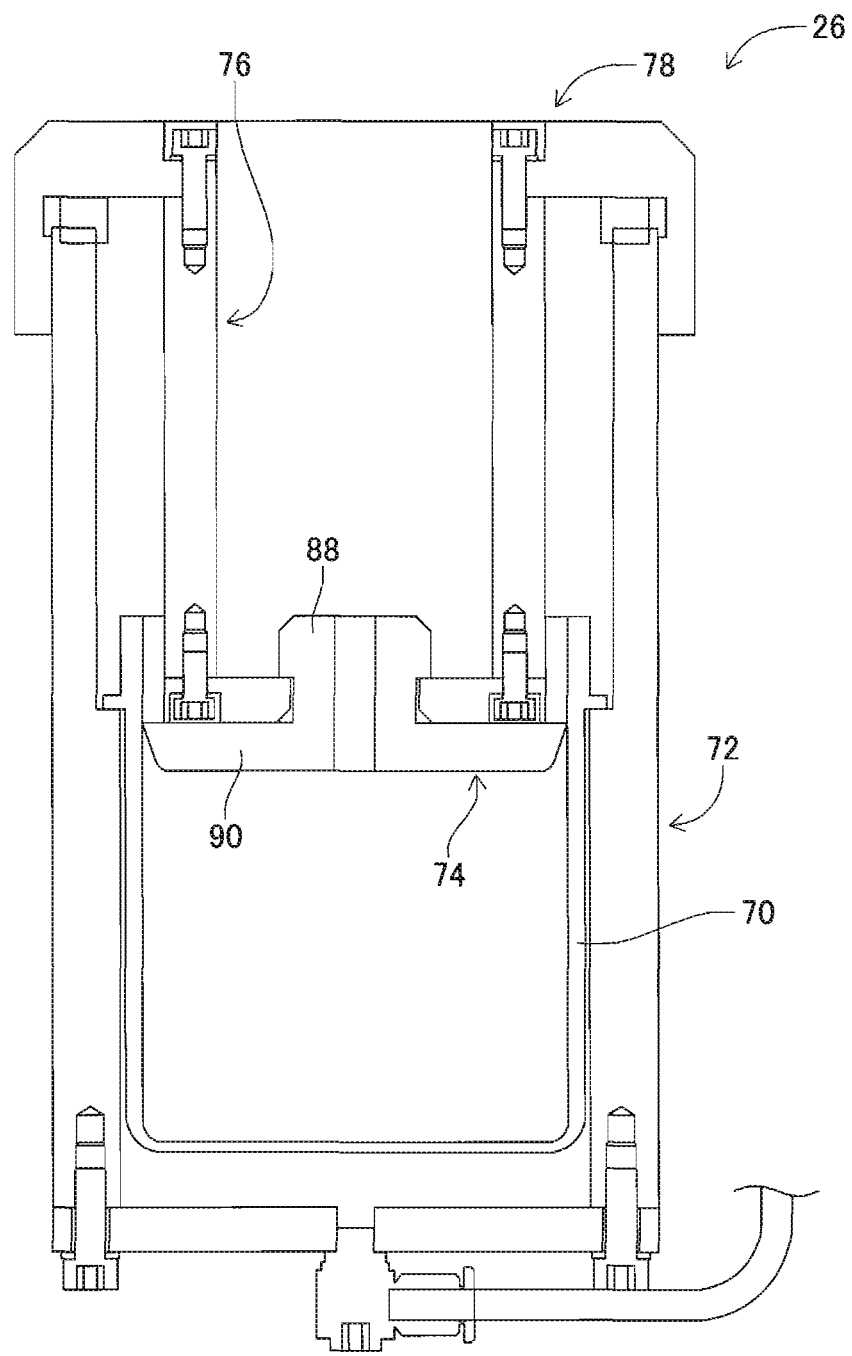
FIG. 8 is a cross-section view of the solder supply device exchanged with a new solder cup.

Continuing, as shown in FIG. 7, a new solder cup 70, that is a solder cup 70 full of solder paste, is set inside outer tube 72. Then, with supply nozzle 74 engaged inside that solder cup 70, fixed lid 78 is engaged with the opening of outer tube 72. By this, as shown in FIG. 8, new solder cup 70 is set inside solder supply device 26. When a new solder cup 70 is set in solder supply device 26, solder supply device 26 is attached to X-axis slider 60, thus completing exchange of solder cup 70.

In this way, with solder printer 10, by the engaging of fixed lid 78 and outer tube 72, fixed lid 78, outer tube 72, inner tube 76, supply nozzle 74, and solder cup 70 are integrated as one, thus an operator is able to hold solder supply device 26 with one hand and easily remove it from solder printer 10. By this, it is possible to perform exchange of solder cup 70 outside of solder printer 10, which makes it possible to curtail getting the inside of solder printer 10 dirty due to fallen solder paste and so on during exchange. Also, the exchange work is performed outside solder printer 10, not in the narrow space inside solder printer 10, thus making exchange work easy to perform. Further, cleaning of solder cup 70 and so on can also be performed outside solder printer 10, so cleaning work is also easy. Also, as given above, supply nozzle 74 is able to be removed from inner tube 76, so supply nozzle 74, which is easily dirtied, is able to be cleaned individually.

Further, with solder supply device 26, as described above, the friction arising between flange section 90 of supply nozzle 74 engaged inside solder cup 70 and the inner circumferential surface of solder cup 70 (hereinafter sometimes referred to as cup internal friction) is smaller than the force required to elastically deform a portion of second outer circumferential surface 102 of nozzle section 88 when removing supply nozzle 74 from inner tube 76, that is, is smaller than the holding force (hereinafter sometimes referred to as nozzle holding force) of supply nozzle 74 by inner tube 76. This enables solder cup exchange work to be performed in few steps.

Figure 9:
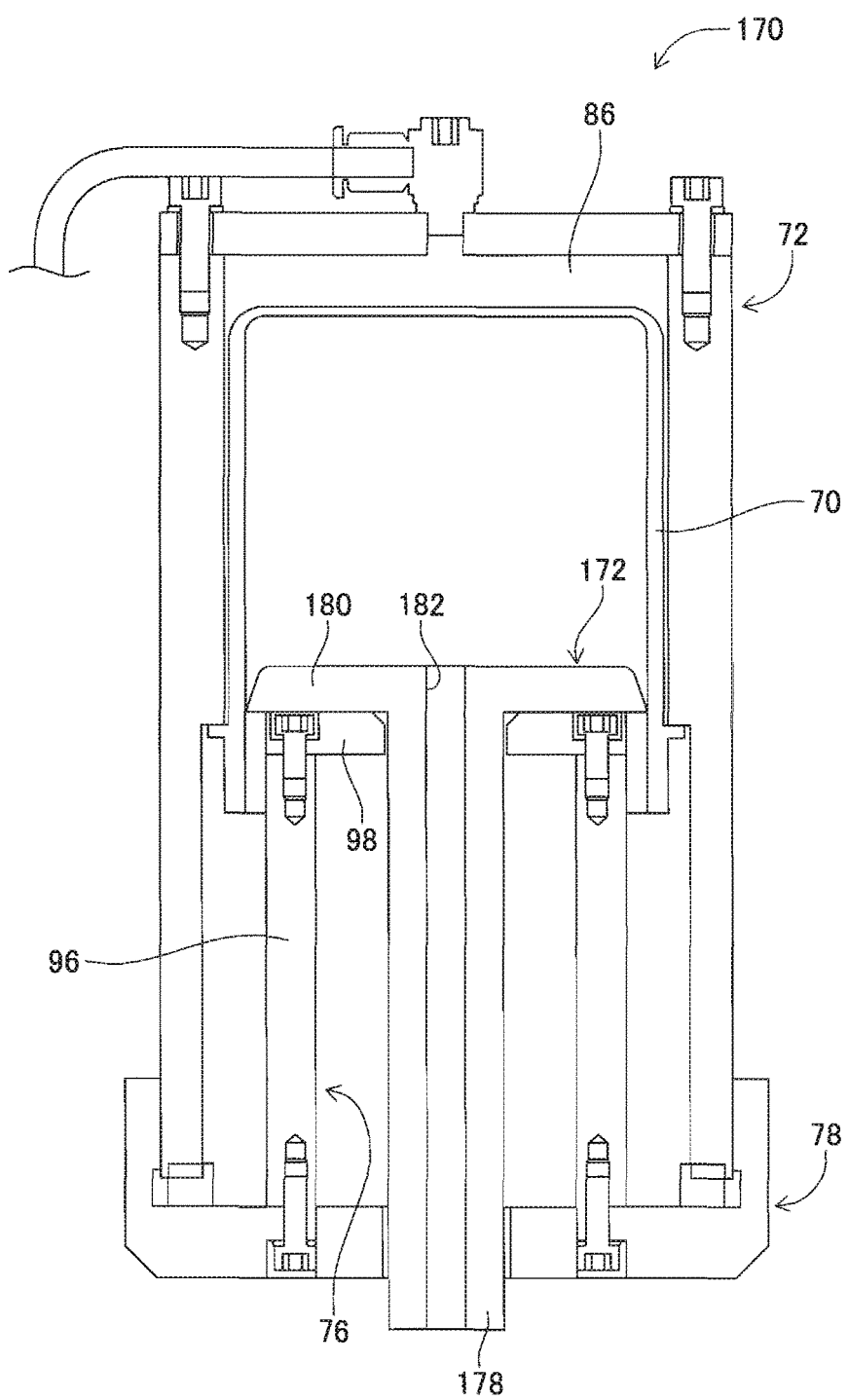
FIG. 9 is a cross-section view showing a comparative example of a solder supply device.

This will be explained in detail using supply device 170 as shown in FIG. 9, supply device 170 having cup internal friction large than the nozzle holding force. Note that, except for supply nozzle 172, solder supply device 170 has substantially the same configuration as solder supply device 26, thus regarding description of configuration elements of solder supply device 170 which have the same function as those of solder supply device 26, the same reference symbols are used and descriptions are abbreviated or omitted.

Also, supply nozzle 172 of solder supply device 170 is configured from nozzle section 178 and flange section 180; nozzle section 178 and flange section 180 are formed as one body from material that is elastically deformable. Nozzle section 178 is substantially cylindrical with nozzle hole 182 formed running through the inside. Flange section 180 extends in a disk shape from the outer circumferential surface of an end of nozzle section 178, and has the same form as flange section 90 of solder supply device 26. Thus, supply nozzle 172 is engaged inside solder cup 70 with the outer circumferential section of flange section 180 elastically deformed.

Also, the outer diameter of nozzle section 178 is slightly smaller than the inside diameter of ring section 98 of inner tube 76, and nozzle section 178 is inserted into the inside diameter section of ring section 98. By this, supply nozzle 172 is held by inner tube 76. In other words, the holding force of supply nozzle 172 by inner tube 76 is zero, and nozzle section 178 of supply nozzle 172 comes out of ring section 98 of inner tube 76 easily. Note that, the length dimension of nozzle section 178 of supply nozzle 172 is longer than the total dimension of the length dimension of inner tube 76 and the thickness dimension of fixed lid 78, and the tip of nozzle section 178 extends from fixed lid 78.

Figure 10:
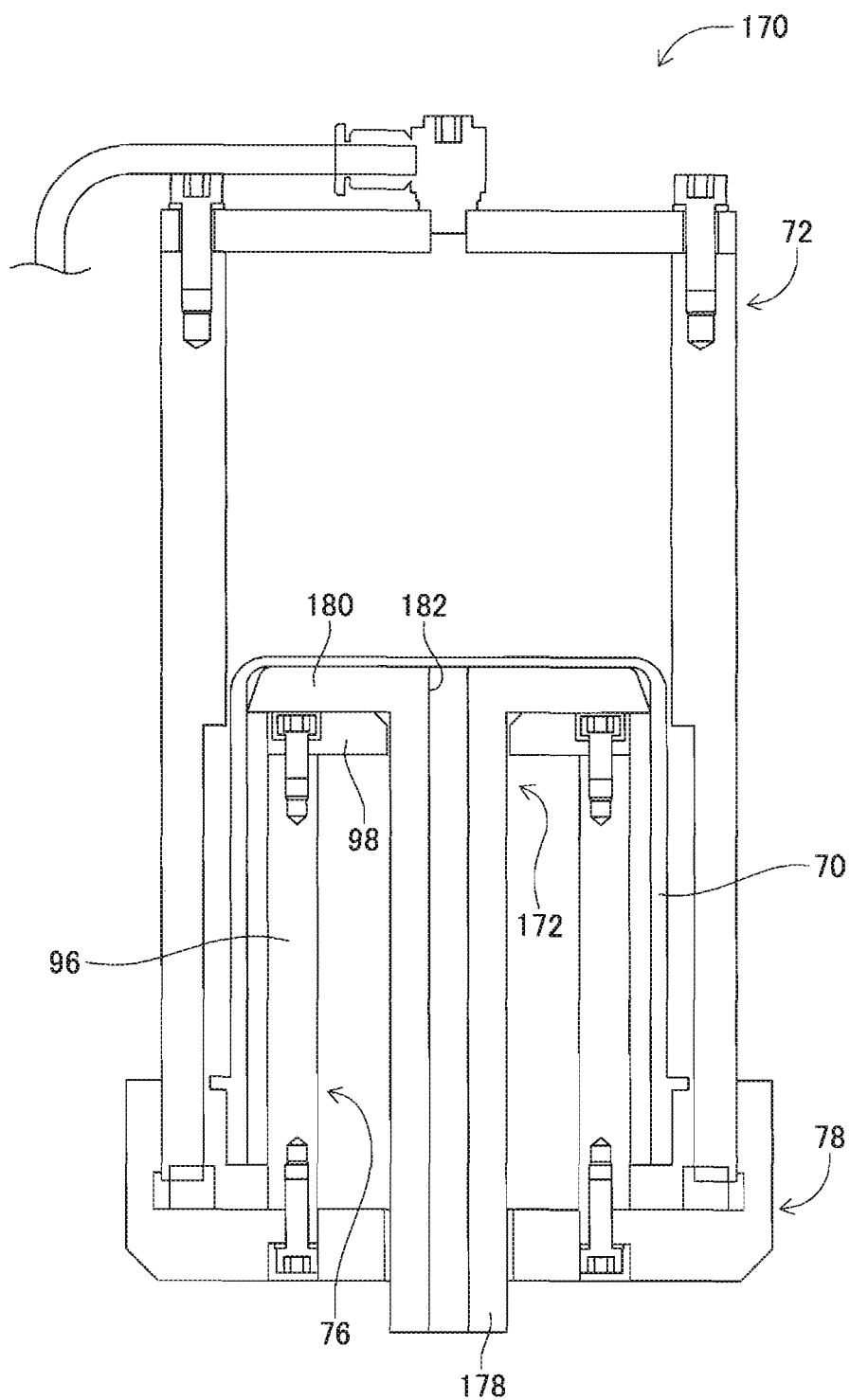
FIG. 10 is a cross-section view showing the solder supply device of FIG. 9 when the cup is empty.

With solder supply device 170 having the above construction, in a similar way to solder supply device 26, by air being supplied to space 86, solder cup 70 moves down, and solder paste filling the inside of solder cup 70 is ejected from nozzle hole 182 of supply nozzle 172. In this case, as shown in FIG. 10, by the bottom surface of solder cup 70 contacting flange section 180 of supply nozzle 172, the downward movement of solder cup 70 is restricted and solder cup 70 becomes empty.

Figure 11:
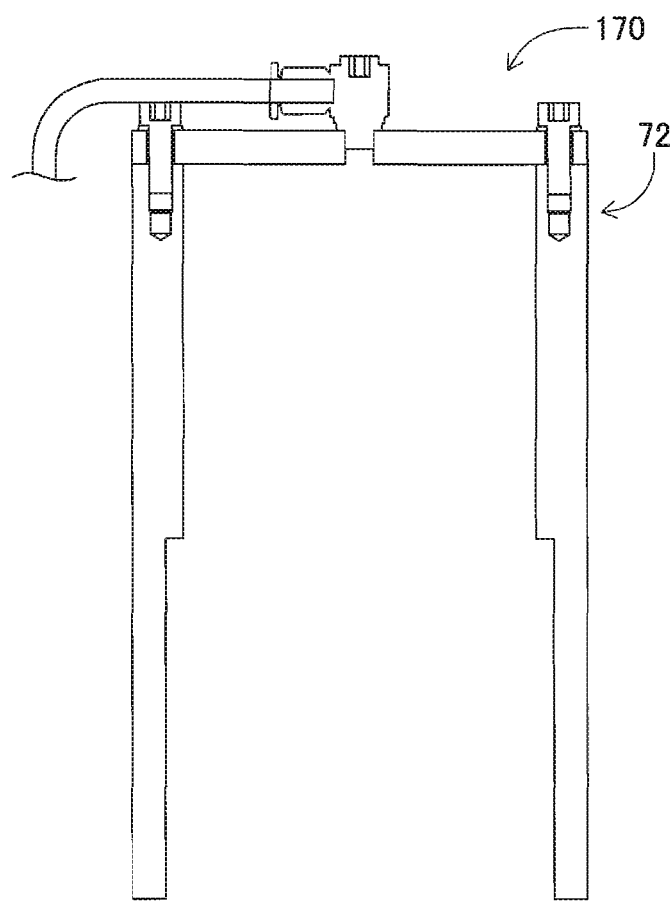
FIG. 11 is a cross-section view showing the solder supply device of FIG. 10 with the outer tube removed.
Figure 11:
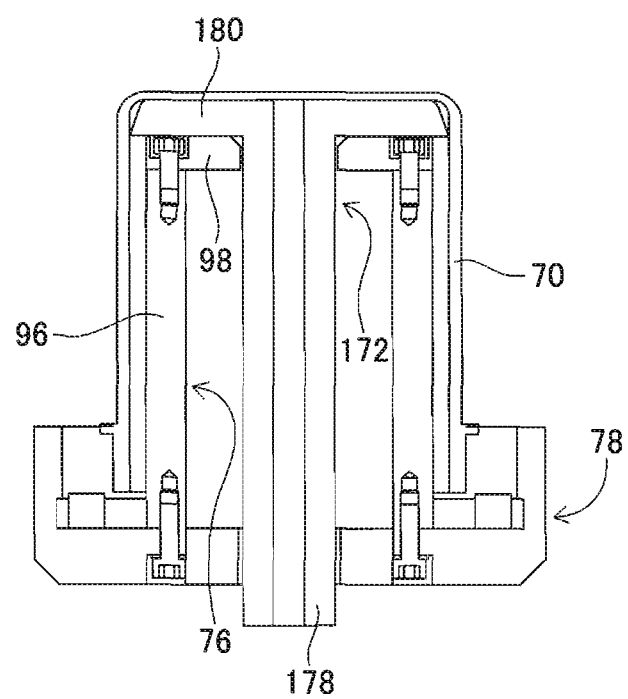

For solder cup exchange work of solder supply device 170, fixed lid 78 is rotated counterclockwise with respect to outer tube 72, so as to release the engagement of fixed lid 78 and outer tube 72. In this case, with fixed lid 78 in a lowered state, as shown in FIG. 11, by separating fixed lid 78 and outer tube 72, fixed lid 78, inner tube 76, supply nozzle 172, and solder cup 70 are removed as one from outer tube 72.

Figure 12:
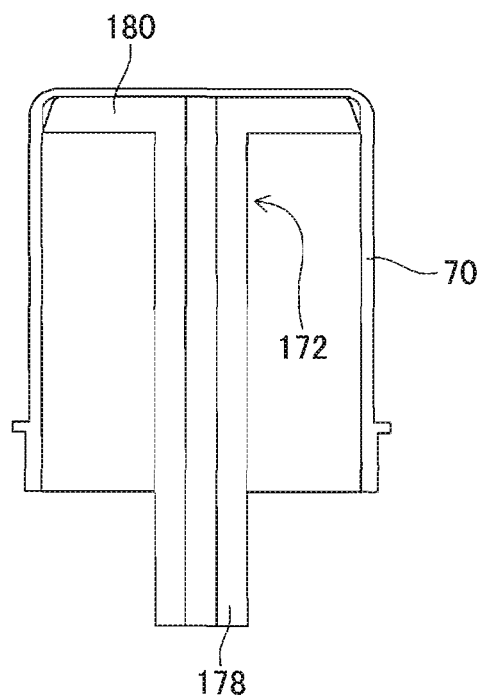
FIG. 12 is a cross-section view showing the solder supply device of FIG. 10 with the inner tube and the supply nozzle separated.
Figure 12:
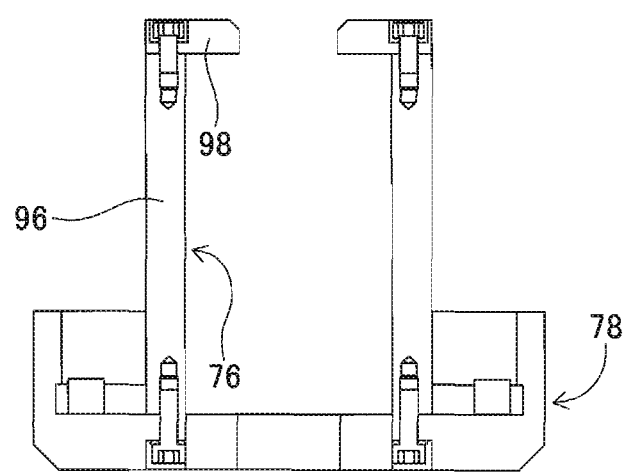

Next, at least one of solder cup 70 and fixed lid 78 is pulled away from the other. By this, as shown in FIG. 12, fixed lid 78 and inner tube 76 are separated as one from solder cup 70. In this case, supply nozzle 172 remains inside solder cup 70. This is because the cup internal elastic force is larger than the nozzle holding force.

Figure 13:
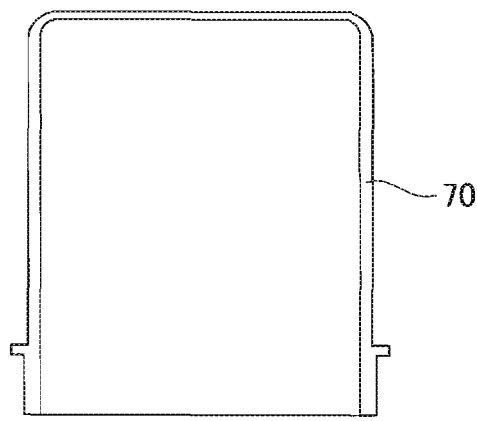
FIG. 13 is a cross-section view showing the solder supply device of FIG. 10 with the supply nozzle and the solder cup separated.
Figure 13:
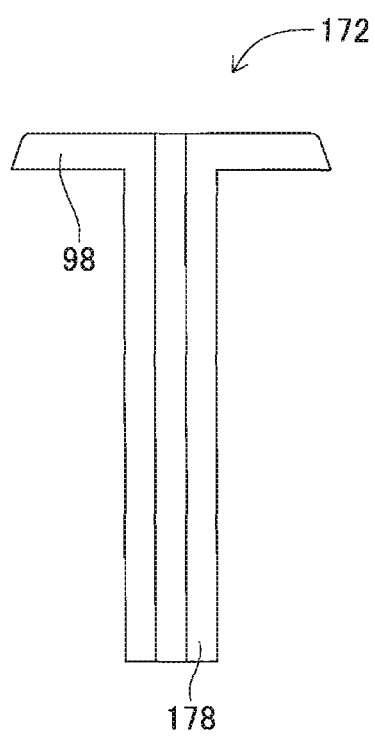

Next, at least one of solder cup 70 and supply nozzle 172 is pulled away from the other. By this, as shown in FIG. 13, supply nozzle 172 is pulled from the inside of solder cup 70, and empty solder cup 70 is removed from solder supply device 170. Note that, because the length dimension of nozzle section 178 of supply nozzle 172 is longer than the depth dimension of solder cup 70, even in a state with flange section 180 of supply nozzle 172 contacting the bottom surface of solder cup 70, the tip of nozzle section 178 extends from the opening of solder cup 70. Thus, when pulling supply nozzle 172 from solder cup 70, an operator is able to grasp nozzle section 178.

When empty solder cup 70 is removed from solder supply device 170, a new solder cup is set inside inner tube 72, and with supply nozzle 172 engaged inside the new solder cup, fixed lid 78 is engaged with the opening of outer tube 72. This completes solder cup exchange.

In this way, to exchange solder cups at solder supply device 170, when removing empty solder cup 70 from solder supply device 170, three steps are required, a step of separating fixed lid 78 and outer tube 72 (refer to FIG. 11), a step of separating fixed lid 78 and solder cup 70 (refer to FIG. 12), and a step of separating supply nozzle 172 and solder cup 70 (refer to FIG. 13). Conversely, with solder supply device 26, empty solder cup 70 is removed by two steps, the step of separating fixed lid 78 and outer tube 72 (refer to FIG. 5), and the step of separating fixed lid 78 and solder cup 70 (refer to FIG. 6).

This is because, with solder supply device 170, the cup internal elastic force is larger than the nozzle holding force, so when fixed lid 78 and solder cup 70 are separated, supply nozzle 172 remains inside solder cup 70. In contrast, with solder supply device 26, the cup internal elastic force is smaller than the nozzle holding force, so when fixed lid 78 and solder cup 70 are separated, supply nozzle 74 is pulled out from solder cup 70, thus there is no need to separate supply nozzle 74 and solder cup 70. In this way, by making the cup internal elastic force smaller than the nozzle holding force, the steps required for removing an empty solder cup can be reduced, meaning that the steps required for solder cup exchange work can be reduced.

Also, with solder supply device 170, as shown in FIG. 12, to pull out supply nozzle 172 from inside solder cup 70, the length dimension of nozzle section 178 is longer than the depth dimension of solder cup 70. This means that a large amount of solder paste remains in nozzle section 178. In contrast, with solder supply device 26, as shown in FIG. 7, for pulling out supply nozzle 74 from inner tube 76 and solder cup 70, it is not necessary for the length dimension of nozzle section 88 to be longer than the depth dimension of solder cup 70. This allows the length dimension of nozzle section 88 to be shorter, which reduces the amount of solder paste that remains in nozzle section 88.

SECOND EMBODIMENT

Figure 14:
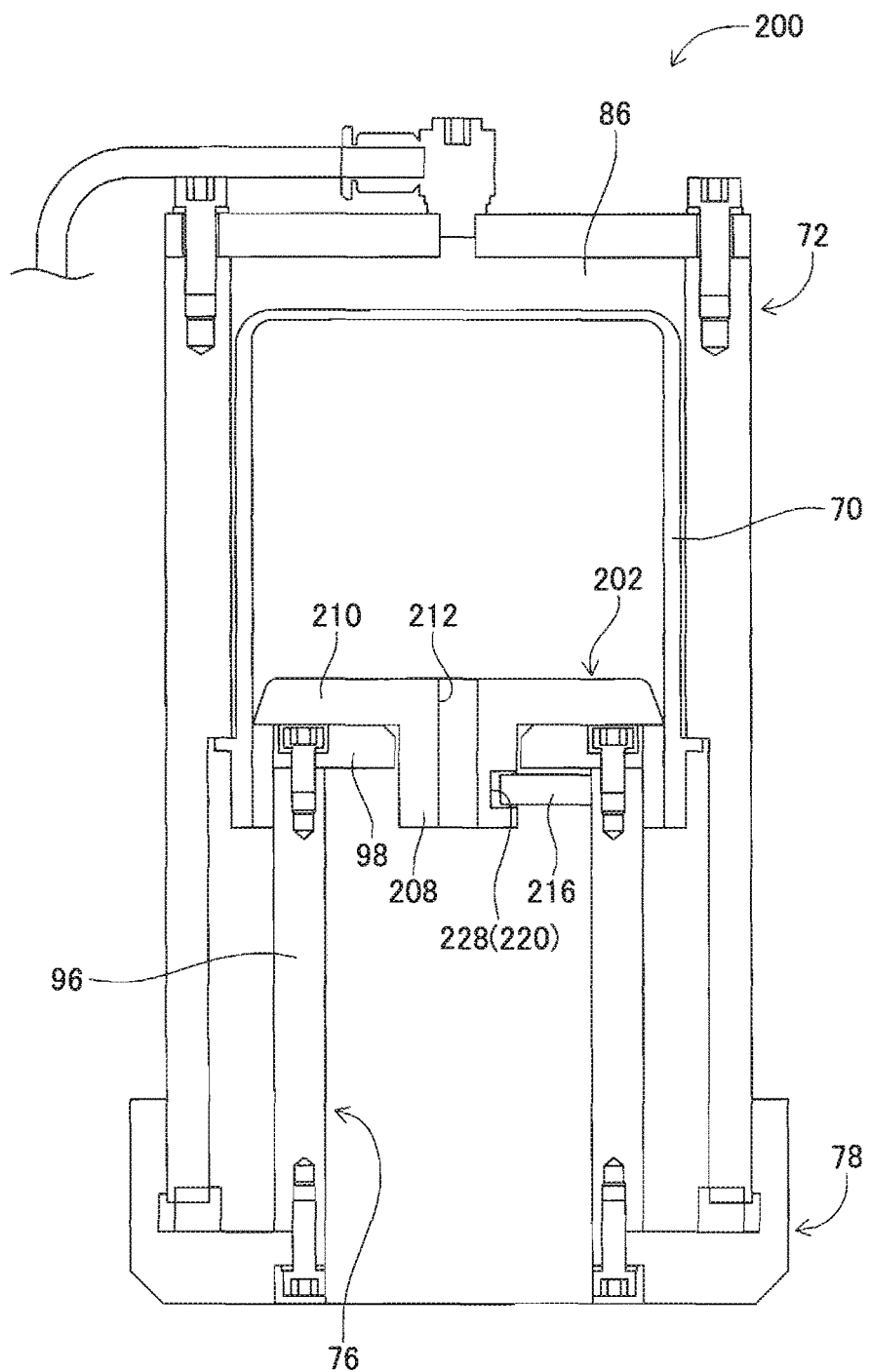
FIG. 14 is a cross-section view showing a second embodiment of a solder supply device.

In the first embodiment of solder supply device 26, inner tube 76 holds supply nozzle 74 depending on the elastic force of nozzle section 88 of supply nozzle 74; however, an inner tube may hold a supply nozzle using a lock mechanism. Solder supply device 200 in which an inner tube holds a supply nozzle using a lock mechanism is shown in FIG. 14 as a second embodiment. Note that, except for supply nozzle 202, the second embodiment of solder supply device 200 has substantially the same configuration as the first embodiment of solder supply device 26, thus regarding description of configuration elements of solder supply device 200 which have the same function as those of solder supply device 26, the same reference symbols are used and descriptions are abbreviated or omitted.

Supply nozzle 202 of solder supply device 200 is configured from nozzle section 208 and flange section 210; nozzle section 208 and flange section 210 are formed as one body from material that is elastically deformable. Nozzle section 208 is substantially cylindrical with nozzle hole 212 formed running through the inside. Flange section 210 extends in a disk shape from the outer circumferential surface of an end of nozzle section 208, and has the same form as flange section 90 of solder supply device 26. Thus, supply nozzle 202 is engaged inside solder cup 70 with the outer circumferential section of flange section 210 elastically deformed.

Also, the outer diameter of nozzle section 208 is slightly smaller than the inside diameter of ring section 98 of inner tube 76, and nozzle section 208 is inserted into the inside diameter section of ring section 98. Here, nozzle section 208 is fixed to inner tube 76 by two locking pins 216 and 218 (only locking pin 216 is shown in FIG. 14) established on an inside wall surface of cylindrical tube section 96 of inner tube 76.

Figure 15:
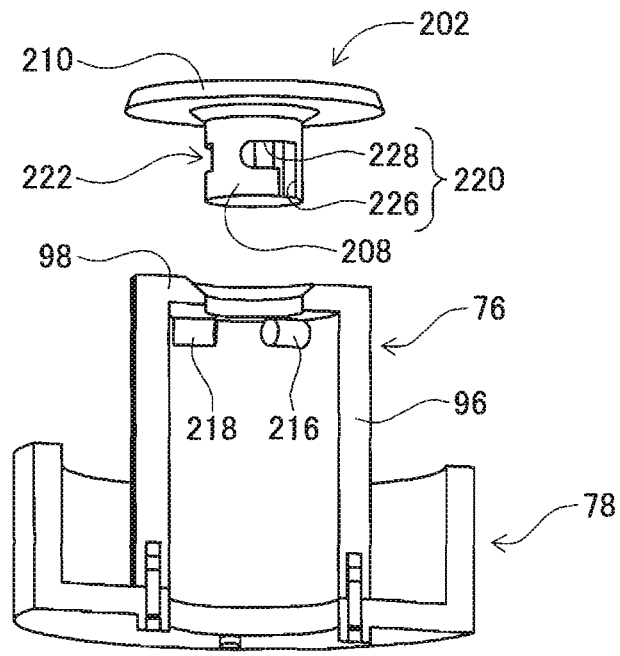
FIG. 15 is a perspective view showing the solder supply device of FIG. 14 with the inner tube and the supply nozzle separated.

In detail, as shown in FIG. 15, two locking pins 216 and 218 are established on an inside wall surface of cylindrical tube section 96 of inner tube 76 extending across the diameter direction. Two recesses 220 and 222 corresponding to the two locking pins 216 and 218 are formed in nozzle section 208 of supply nozzle 202. Each recess 220 and 222 is cut to extend in an axis direction of nozzle section 208, and is formed from a first recess section 226 open at the lower end of nozzle section 208, and a second recess section 228 extending in a circumferential direction of nozzle section 208 from the end opposite to the opening of first recess section 226. That is, recesses 220 and 222 are cut to substantially form an L-shape.

Figure 16:
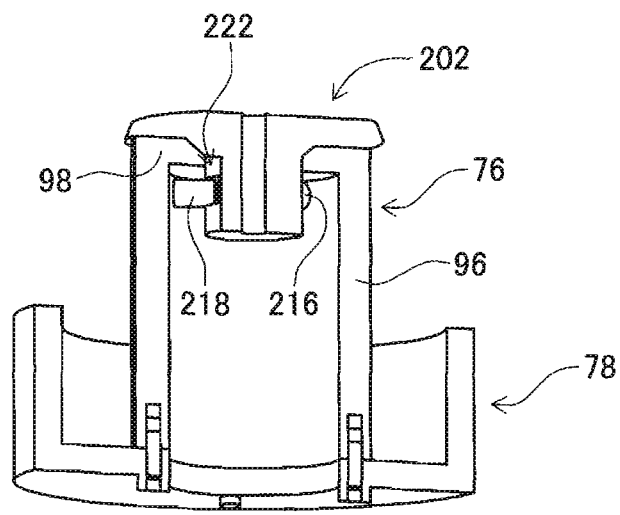
FIG. 16 is a perspective view showing the solder supply device of FIG. 15 with the supply nozzle attached to the inner tube. Description of Preferred Embodiments The following describes in detail referring to the figures an example embodiment of the present disclosure.

Also, with the opening of first recess section 226 of recess 220 and the tip of locking pin 216 aligned, and the opening of first recess section 226 of recess 222 and the tip of locking pin 218 aligned, nozzle section 208 is inserted in the inside diameter section of ring section 98. By this, locking pin 216 is inserted inside first recess section 226 of recess 220, and locking pin 218 is inserted inside first recess section 226 of recess 222. Further, by rotating supply nozzle 202 counterclockwise with respect to inner tube 76, locking pin 216 is inserted inside second recess section 228 of recess 220, and locking pin 218 is inserted inside second recess section 228 of recess 222. By this, as shown in FIG. 16, nozzle section 208 is fixed to inner tube 76. That is, supply nozzle 202 is detachably attached to inner tube 76 using a lock mechanism configured from locking pins 216 and 218 and recesses 220 and 222.

The holding force of supply nozzle 202 by inner tube 76 when supply nozzle 202 is attached to inner tube 76 using the lock mechanism, that is, the nozzle holding force, is naturally larger than the cup internal elastic force. Thus, the same effects as solder supply device 26 of the first embodiment are achieved with the solder supply device 200 of the second embodiment.

Note that, in the above embodiments, solder supply device 26 is an example of a solder supply device. Solder cup 70 is an example of a solder container. Outer tube 72 is an example of an outer tube. Inner tube 76 is an example of a holding member. Space 86 is an example of an air chamber. Nozzle section 88 is an example of a nozzle. Flange section 90 is an example of a piston. Solder supply device 200 is an example of a solder supply device. The lock mechanism configured from locking pins 216 and 218 and recesses 220 and 222 is an example of a lock mechanism.

Further, the present disclosure is not limited to the above example embodiments, and various changed or improved methods of embodiment are possible based on the knowledge of someone skilled in the art. Specifically, for example, in the above embodiments, a solder supply device that moves solder cup 70 by supplying air to space 86 demarcated by solder cup 70 and outer tube 72 and so on is used; however, a solder supply device that moves solder cup 70 using a drive source such as a cylinder device or electromagnetic motor may be used.

Also, in the above embodiments, a solder supply device that supplies solder paste from solder cup 70 by moving solder cup 70 is used; however, a solder supply device that supplies solder paste from solder cup 70 by moving supply nozzles 74 or 202 may be used.

Also, in the above embodiments, flange sections 90 and 210 of nozzle sections 88 and 208 are formed as one body from material that is elastically deformable; however, nozzle sections 88 and 208 do not have to be formed from material that is elastically deformable. That is, it is sufficient if only flange sections 90 and 210 are formed from material that is elastically deformable. Also, it is not necessary that the entire flange sections 90 and 210 are formed from material that is elastically deformable, it is sufficient if only a portion of flange sections 90 and 210 are formed from material that is elastically deformable. Specifically, for example, it is acceptable to fill a sealing or the like in an outer circumferential section of a metal flange section. That is, it is acceptable if a portion that is not elastically deformable exists in the thickness direction in the outer circumferential section of the flange section. Also, it is acceptable if a portion that is not elastically deformable exists in the circumferential direction in the outer circumferential section of the flange section.

Also, in the second embodiment, locking pins 216 and 218 and recesses 220 and 222 are used for locking nozzle section 208 of supply nozzle 202; however, a lock mechanism that uses a plunger pin, magnet, latch, or the like may be used. Also, nozzle section 208 and flange section 210 may be locked at the same time by the lock mechanism, or only flange section 210 may be locked by the lock mechanism.

REFERENCE SIGNS LIST

26: solder supply device; 70: solder cup (solder container); 72: outer tube; 76: inner tube (holding member); 86: space (air chamber); 88: nozzle section (nozzle); 90: flange section (piston); 200: solder supply device; 216: locking pin (lock mechanism); 218: locking pin (lock mechanism); 220: recess (lock mechanism); 222: recess (lock mechanism)

The invention claimed is:

1. A solder supply device comprising:
  a solder container housing liquid solder, said solder container is tubular and open at a first end;
  a nozzle, for ejecting solder from the solder container, that is inserted into the solder container;
  a piston that is fixedly provided on an outer circumferential section of the nozzle and that is engaged inside of the solder container front an opening of the solder container;
  a drive source that moves the solder container and the piston relatively; and
  a holding member including a first end which holds at least one of the nozzle or the piston, and a second end which extends from the opening of the solder container,
  wherein at least a portion of an outer edge section of the piston is formed from an elastically deformable material, the piston is engaged inside the solder container with at least the portion of the outer edge section in an elastically deformed state, and an elastic force arising between the outer edge section of the piston and an inside section of the solder container is smaller than a holding force of at least one of the nozzle and the piston by the holding member,
  wherein the solder supply device is further provided with an outer tube that is tubular with an opening at a first end, said outer tube stores the solder container in a state where a second end of the solder container engages the opening of the outer tube,
  wherein the solder container and the piston are relatively moved by air being supplied to an air chamber that is demarcated by the second end of the solder container and a second end of the outer tube, so as to supply solder from the tip of the nozzle,
  wherein the holding member comprises:
    an inner tube including a cylindrical tube section and a ring section covering an edge at a first end of the cylindrical tube section, the nozzle being held by the ring section; and a fixed lid which is removably attached to the opening of the outer tube and which is fixed to a second end of the cylindrical tube section, and wherein when the fixed lid is removed from the outer tube, the inner tube, the nozzle, and the solder cup are removed as one from the outer tube.

2. The solder supply device according to claim 1, wherein the solder supply device is further provided with a lock mechanism for detachably attaching at least one of the nozzle and the piston to the holding member, and the holding member holds at least one of the nozzle and the piston by at least one of the nozzle and the piston being attached to the holding member by the lock mechanism.

3. The solder supply device according to claim 1, wherein the nozzle is formed from an elastically deformable material, the holding member holds the nozzle by elastic deformation of the nozzle, and the elastic force arising between the outside edge section of the piston and the inside of the solder container is smaller than the elastic force which depends on the elastic deformation of the nozzle.

4. The solder supply device according to claim 1, wherein a total dimension of a thickness dimension of the piston and a length dimension of the holding member is longer than a depth dimension of the solder container.

5. The solder supply device according to claim 1, wherein a length dimension of the nozzle is shorter than a depth dimension of the solder container.

* * * * *